United States Patent
Chou et al.

(10) Patent No.: US 11,026,338 B2
(45) Date of Patent: Jun. 1, 2021

(54) WATERPROOF CASING OF OUTDOOR WIRELESS ELECTRONIC DEVICE

(71) Applicant: DELTA ELECTRONICS, INC., Taoyuan (TW)

(72) Inventors: Ching-Ho Chou, Taoyuan (TW); Po-Heng Chao, Taoyuan (TW); Hung-Chi Chen, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 178 days.

(21) Appl. No.: 16/278,164

(22) Filed: Feb. 17, 2019

(65) Prior Publication Data
US 2020/0093018 A1    Mar. 19, 2020

(30) Foreign Application Priority Data

Sep. 19, 2018 (CN) .......................... 201811092413.1

(51) Int. Cl.
*H05K 5/00*    (2006.01)
*H05K 5/06*    (2006.01)
(Continued)

(52) U.S. Cl.
CPC .............. *H05K 5/061* (2013.01); *H02G 3/22* (2013.01); *H05K 5/0247* (2013.01); *H05K 5/03* (2013.01); *H05K 5/069* (2013.01); *H05K 7/1427* (2013.01)

(58) Field of Classification Search
CPC ........ H05K 5/061; H05K 5/0247; H05K 5/03; H05K 5/069; H05K 7/1427; H05K 5/00; H05K 5/04; H05K 5/02; H05K 5/0217; H02G 3/22; H02G 3/08; H02G 3/081; H02G 3/088; H01R 13/46; H01R 13/52; H01R 13/502; H01R 13/5202
(Continued)

(56) References Cited

U.S. PATENT DOCUMENTS 4,791,717 A * 12/1988 Hemmie ................. H01P 1/205
174/560
5,020,149 A * 5/1991 Hemmie ................. H01P 1/205
174/541
(Continued)

FOREIGN PATENT DOCUMENTS

CN        103369896 A     10/2013
CN        204217169 U      3/2015
(Continued)

*Primary Examiner* — Angel R Estrada
(74) *Attorney, Agent, or Firm* — CKC & Partners Co., LLC

(57) ABSTRACT

A waterproof casing for packaging a circuit board having an antenna includes a housing, a waterproof gasket, and an end cover. The housing has an accommodation space and a side opening communicating with each other. The accommodation space is configured to accommodate the circuit board. The waterproof gasket includes a main body and an extending portion. The main body covers the side opening. The extending portion extends from the main body. The end cover abuts against a side of the main body away from the accommodation space, and is fixed to the housing to form a box with the housing. The box has a communication opening positioned corresponding to the antenna. The extending portion hermetically covers the communication opening.

12 Claims, 7 Drawing Sheets

(51) Int. Cl.
*H02G 3/22* (2006.01)
*H05K 5/02* (2006.01)
*H05K 5/03* (2006.01)
*H05K 7/14* (2006.01)

(58) Field of Classification Search
USPC ..... 174/50, 66, 67, 50.51, 520; 220/3.2–3.9, 220/4.02, 241, 242; 361/752, 736, 641, 361/719, 600, 601
See application file for complete search history.

(56) References Cited

U.S. PATENT DOCUMENTS

| | | | |
|---|---|---|---|
| 5,107,404 A * | 4/1992 | Tam | H04B 1/38 361/736 |
| 5,942,728 A | 8/1999 | Chen | |
| 6,069,317 A | 5/2000 | Wagganer | |
| 6,455,768 B2 | 9/2002 | Negishi | |
| 6,831,222 B2 | 12/2004 | Pastuch | |
| 7,372,705 B1 * | 5/2008 | Spivey | H05K 7/20445 174/520 |
| 7,563,991 B2 * | 7/2009 | Twitchell, Jr. | H05K 5/0004 174/560 |
| 7,737,360 B2 * | 6/2010 | Wiemeyer | H04Q 1/13 174/50 |
| 7,829,786 B2 * | 11/2010 | Fuerstenberg | H05K 5/06 174/50 |
| 8,053,668 B2 | 11/2011 | Lai et al. | |
| 8,420,937 B2 * | 4/2013 | Hsu | H05K 5/063 174/91 |
| 8,519,264 B2 | 8/2013 | Elmoursi et al. | |
| D692,827 S | 11/2013 | Chen et al. | |
| 8,772,635 B2 * | 7/2014 | Chen | H05K 5/061 174/50 |
| 8,796,548 B2 | 8/2014 | Rost et al. | |
| 8,902,599 B2 | 12/2014 | Chao et al. | |
| 9,565,744 B2 | 2/2017 | Lai et al. | |
| 9,744,629 B2 * | 8/2017 | Chai | B23P 19/04 |
| 9,854,651 B2 | 12/2017 | Lai et al. | |
| 2013/0258616 A1 | 10/2013 | Chao et al. | |
| 2013/0286597 A1 | 10/2013 | Zhang et al. | |

FOREIGN PATENT DOCUMENTS

| | | |
|---|---|---|
| CN | 106061174 A | 10/2016 |
| CN | 206145627 U | 5/2017 |
| CN | 107866943 A | 4/2018 |
| WO | 2015025267 A1 | 2/2015 |

* cited by examiner

WATERPROOF CASING OF OUTDOOR WIRELESS ELECTRONIC DEVICE

RELATED APPLICATIONS

This application claims priority to China Application Serial Number 201811092413.1, filed Sep. 19, 2018, the disclosure of which is incorporated herein by reference in its entirety.

BACKGROUND

Technical Field

The present disclosure relates to a waterproof casing of an outdoor wireless electronic device.

Description of Related Art

A LED driver with a wireless function has a communication opening on the metal casing. The communication opening faces towards an antenna of the LED driver, so as to allow the antenna to conduct wireless communication through the communication opening. For an outdoor LED driver that requires a waterproof capability, the communication opening has to be covered to prevent liquid from entering the casing and affecting the functioning of a circuit board inside the casing.

Currently, a widely-adopted conventional technique of providing outdoor LED driver with the waterproof capability is to attach a non-metallic mask to the casing to cover the communication opening. However, this conventional technique has the problem that the mask may fall off easily. In addition, the degree of tightness between the mask and the casing may be poor, and thus the liquid may enter the gap between the mask and the casing.

Consequently, how to provide a waterproof casing to resolve the aforementioned issues is one of the directions that should be urgently endeavored.

SUMMARY

In view of the foregoing, one of the objects of the present disclosure is to provide a waterproof casing with excellent tightness.

To achieve the objective stated above, in accordance with an embodiment of the present disclosure, a waterproof casing for packaging a circuit board having an antenna includes a housing, a waterproof gasket, and an end cover. The housing has an accommodation space and a side opening communicating with each other. The accommodation space is configured to accommodate the circuit board. The waterproof gasket includes a main body and an extending portion. The main body covers the side opening. The extending portion extends from the main body. The end cover abuts against a side of the main body away from the accommodation space and is fixed to the housing to form a box with the housing. The box has a communication opening positioned corresponding to the antenna. The extending portion hermetically covers the communication opening.

In one or more embodiments of the present disclosure, the communication opening is located on the end cover. The extending portion of the waterproof gasket extends into the communication opening, and a peripheral edge of the extending portion hermetically abuts against an inner edge of the communication opening.

In one or more embodiments of the present disclosure, the communication opening is located on the housing. The extending portion of the waterproof gasket extends from an edge of the main body and hermetically covers the communication opening.

In one or more embodiments of the present disclosure, the communication opening communicates with the side opening.

In one or more embodiments of the present disclosure, the extending portion has an inner ring structure that extends beyond an inner edge of the communication opening and hermetically abuts against an inner surface of the housing.

In one or more embodiments of the present disclosure, the extending portion has an outer ring structure that extends beyond an inner edge of the communication opening and hermetically abuts against an outer surface of the housing.

In one or more embodiments of the present disclosure, the waterproof gasket further includes a platform extending into the accommodation space through the side opening. A peripheral edge of the platform hermetically abuts against an inner surface of the housing.

In one or more embodiments of the present disclosure, the end cover has a wire opening. The waterproof gasket further includes a wire bushing that is connected to a side of the main body facing towards the wire opening. The wire bushing passes through the wire opening. The waterproof gasket further has a channel passing through the main body and the wire bushing.

In one or more embodiments of the present disclosure, the waterproof gasket further includes a protrusion disposed on a side of the main body facing towards the accommodation space. The protrusion is configured to abut against the circuit board.

In one or more embodiments of the present disclosure, the end cover includes a covering portion and a fixing portion. The covering portion abuts against the side of the main body away from the accommodation space. The fixing portion extends from an edge of the covering portion.

In one or more embodiments of the present disclosure, the end cover has plural first through holes. The waterproof gasket has plural second through holes. The end cover is fixed to the housing by plural fixing members passing through the first through holes and the second through holes.

In sum, in the waterproof casing of the present disclosure, the waterproof gasket includes the extending portion to seal the communication opening, thereby resolving issues of poor tightness between the mask and the casing and the mask easily falling off found in conventional waterproof structure.

BRIEF DESCRIPTION OF THE DRAWINGS

To make the objectives, features, advantages, and examples of the present invention, including those mentioned above and others, more comprehensible, descriptions of the accompanying drawings are provided as follows.

DETAILED DESCRIPTION

Figure 1:
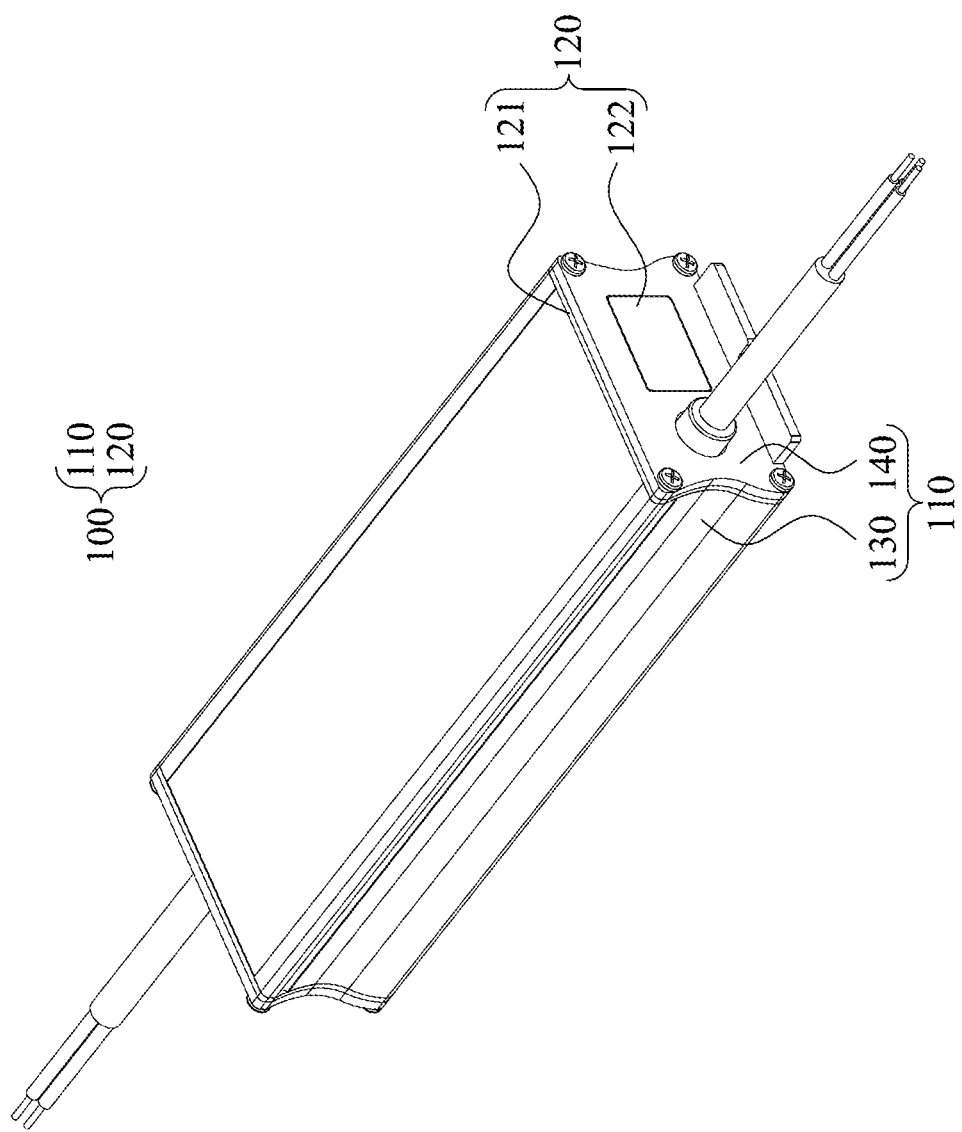
FIG. 1 illustrates an assembled view of a waterproof casing in accordance with an embodiment of the present disclosure.

For the sake of the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, these details should not be used to limit the present disclosure.

Figure 2:
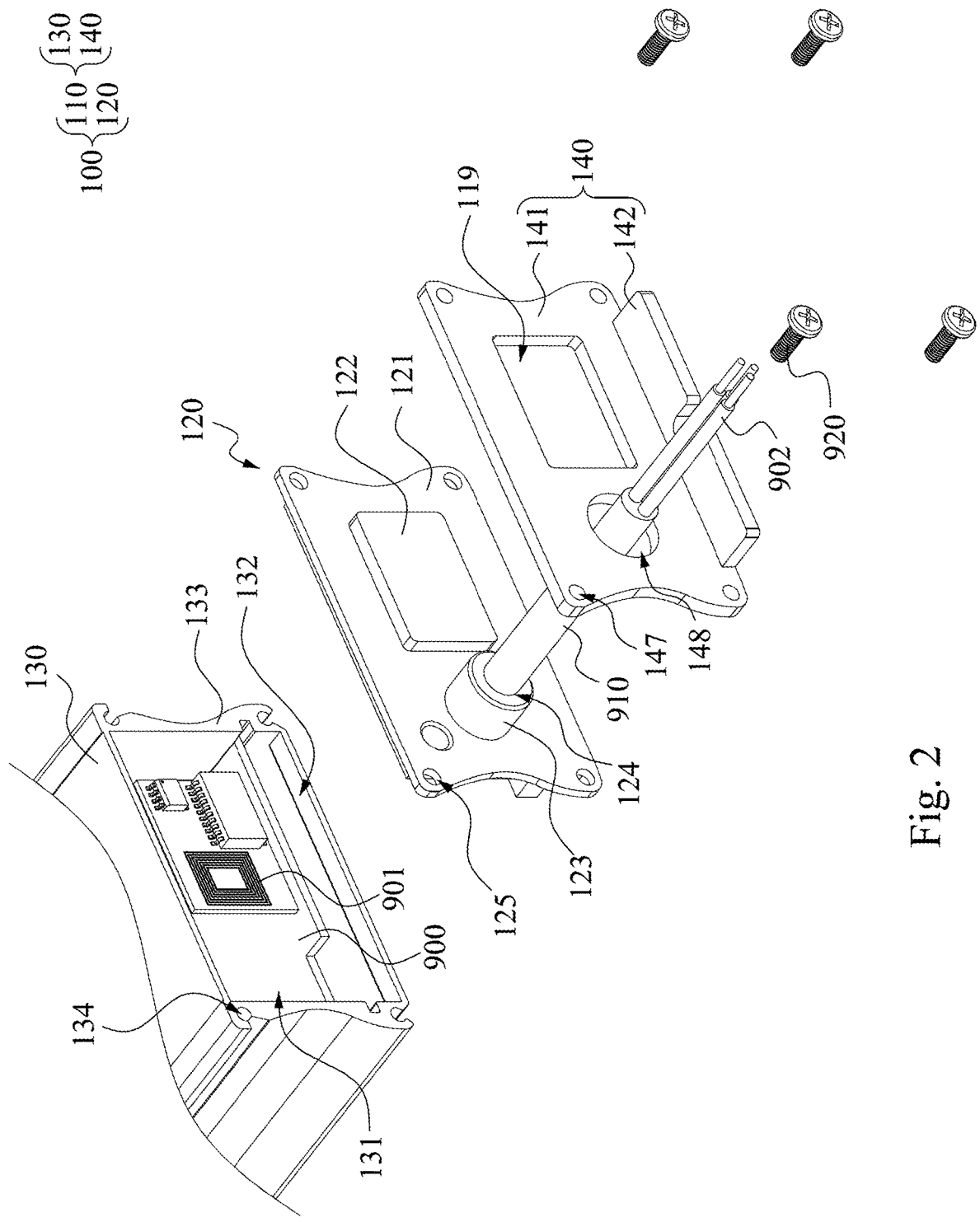
FIG. 2 is a partially enlarged exploded view of the waterproof casing shown in FIG. 1.

Please refer to FIGS. 1 and 2. FIG. 1 illustrates an assembled view of a waterproof casing 100 in accordance with an embodiment of the present disclosure, and FIG. 2 is a partially enlarged exploded view of the waterproof casing 100 shown in FIG. 1. The waterproof casing 100 is used to package a circuit board 900 having an antenna 901. For example, the antenna 901 may be a NFC (Near-Field Communication) antenna, but the present disclosure is not limited thereto. The waterproof casing 100 is applicable to an outdoor wireless electronic device (e.g., a LED driver with a wireless function). The waterproof casing includes a box 110 and a waterproof gasket 120. The box 110 includes a housing 130 and an end cover 140. The waterproof gasket 120 is partially compressed between the housing 130 and the end cover 140.

As shown in FIG. 2, the housing 130 has an accommodation space 131 and a side opening 132 communicating with each other. The circuit board 900 is located in the accommodation space 131. The waterproof gasket 120 includes a main body 121 and an extending portion 122 extending from the main body 121. The main body 121 covers the side opening 132. Specifically, the housing 130 has a circular end surface 133 surrounding the side opening 132. The main body 121 of the waterproof gasket 120 hermetically abuts against the circular end surface 133 and covers the side opening 132, thereby preventing liquid from entering the accommodation space 131 through the side opening 132. The end cover 140 abuts against a side of the main body 121 away from the accommodation space 131 and is fixed to the circular end surface 133 of the housing 130.

In the present embodiment, as shown in FIG. 2, the antenna 901 is located on a side of the circuit board 900 facing towards the side opening 132. With respect to the durability of the waterproof casing 100, the housing 130 and the end cover 140 may be made of metallic materials. To prevent the antenna 901 from being shielded by the housing 130 and the end cover 140, the box 110 has a communication opening 119. The communication opening 119 is positioned corresponding to the antenna 901. In other words, the communication opening 119 is located on the end cover 140 and faces towards the antenna 901, thereby allowing the antenna 901 to conduct wireless transmission through the communication opening 119. The extending portion 122 of the waterproof gasket 120 is located on a side of the main body 121 away from the accommodation space 131 and extends into the communication opening 119. A peripheral edge of the extending portion 122 hermetically abuts against an inner edge of the communication opening 119 to prevent liquid penetration.

Compared to the conventional waterproof casing including a mask adhered to the outside of the communication opening to cover the communication opening, the waterproof casing 100 of the present disclosure seals the communication opening 119 by using the extending portion 122 integrally formed with the main body 121. Therefore, the waterproof gasket 120 not only does not easily fall off, but also has greater tightness.

In some embodiments, as shown in FIG. 2, the end cover 140 has a wire opening 148. The waterproof gasket 120 further includes a wire bushing 123 that extends from a side of the main body 121 facing towards the end cover 140 and passes through the wire opening 148. The waterproof gasket 120 further has a channel 124 passing through the main body 121 and the wire bushing 123. The circuit board 900 has plural power cords 902. The power cords 902 pass through the channel 124 and extend out of the waterproof casing 100. In some embodiments, a wire-wrapping member 910 surrounds and wraps the power cords 902. The wire-wrapping member 910 passes through the channel 124 and hermetically abuts against an inner surface of the channel 124, thereby preventing liquid from entering the accommodation space 131 through the channel 124.

In some embodiments, as shown in FIG. 2, the end cover 140 includes a covering portion 141 and a fixing portion 142. The covering portion 141 abuts against the side of the main body 121 away from the accommodation space 131. The communication opening 119 and the wire opening 148 are located on the covering portion 141. The fixing portion 142 extends perpendicularly from an edge of the covering portion 141. The waterproof casing 100 may be installed outdoors (e.g., installed on a wall of a building or on a street light) by fixing the fixing portion 142 to an outdoor object with securing members such as screws.

In some embodiments, as shown in FIG. 2, the circular end surface 133 has plural fixing holes 134. The end cover 140 has plural first through holes 147 located on the covering portion 141. The waterproof gasket 120 has plural second through holes 125 located on the main body 121. Each of the first through holes 147 is aligned with a corresponding second through hole 125 and a corresponding fixing hole 134. The end cover 140 is fixed to the housing 130 by plural fixing members 920 (such as screws) passing through the first through holes 147, the second through holes 125, and the fixing holes 134 in sequence. Therefore, the circular end surface 133 of the housing 130 and the main body 121 of the waterproof gasket 120 are ensured to be stably kept in a tightly fitted state, so as to maintain the waterproof capability of the waterproof casing 100.

Although the circular end surface 133 shown in FIG. 2 has four fixing holes 134 at the corners, it should be realized that the present disclosure is not limited thereto. A person with an ordinary skill in relevant art may adjust the number of fixing holes 134 based on practical applications. For example, additional fixing holes (and additional first through holes and second through holes corresponding to the additional fixing holes) may be positioned on the four edges of the circular end surface 133, thereby increasing the degrees of tightness between the waterproof gasket 120 and the circular end surface 133.

Figure 3:
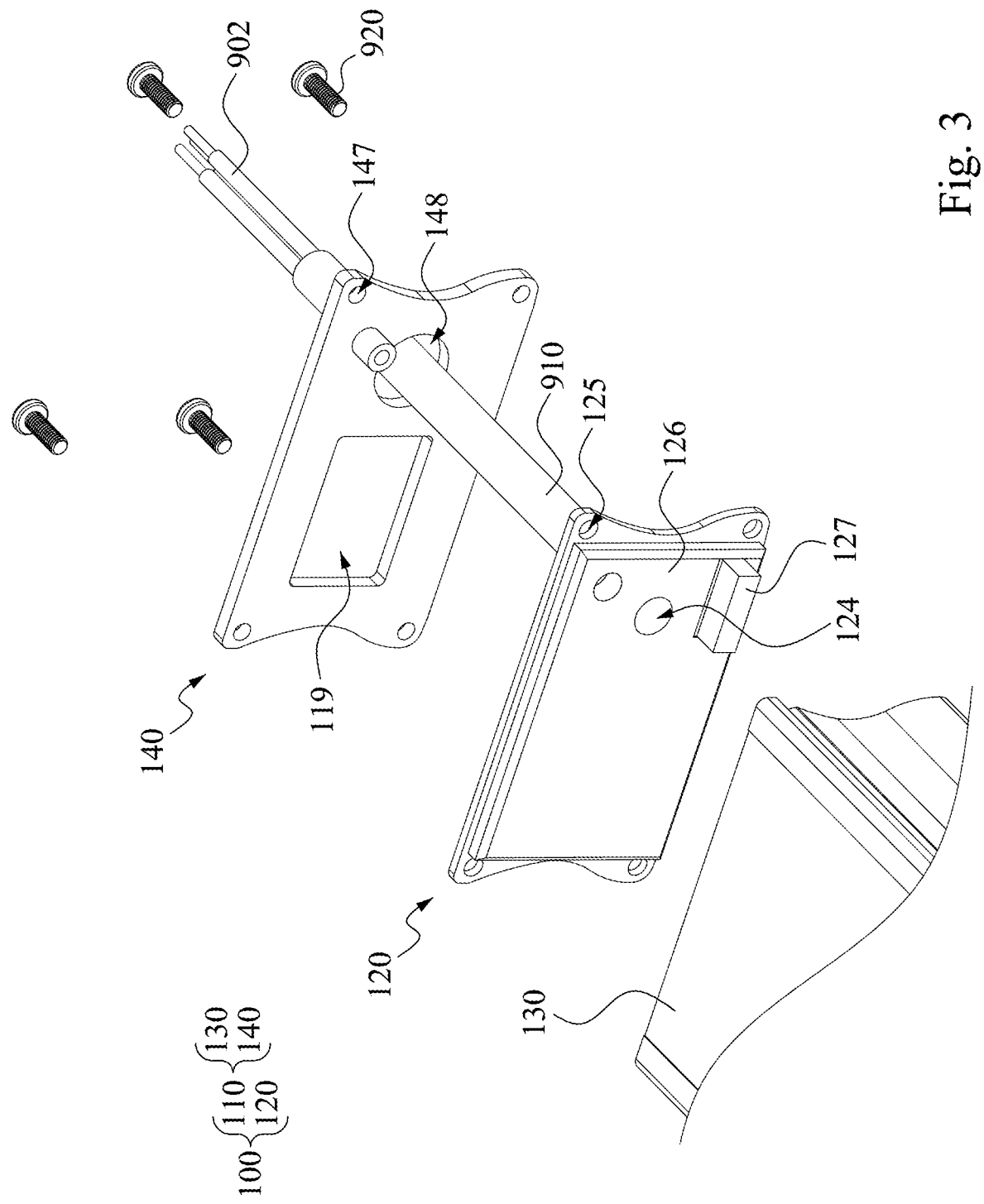
FIG. 3 is another partially enlarged exploded view of the waterproof casing shown in FIG. 1.

Please refer to FIG. 3, which is another partially enlarged exploded view of the waterproof casing 100 shown in FIG. 1. In some embodiments, the waterproof gasket 120 further includes a platform 126 that is disposed on a side of the main body 121 facing towards the accommodation space 131 and extends into the accommodation space 131 through the side opening 132. A peripheral edge of the platform 126 hermetically abuts against an inner surface of the housing 130, thereby further improving the waterproof capability of the waterproof casing 100.

In some embodiments, before the waterproof gasket 120 and the housing 130 are assembled, a cross-sectional area of the platform 126 is slightly larger than that of the side opening 132. Consequently, force has to be applied to push the platform 126 to pass through the side opening 132, so as to combine the waterproof gasket 120 and the housing 130 together. After the waterproof gasket 120 and the housing 130 are assembled, the difference in cross-sectional areas described above causes the peripheral edge of the platform 126 and the inner surface of the housing 130 to be tightly fitted, thereby sealing the side opening 132.

Furthermore, the platform 126 has a positioning function. During the assembly of the waterproof casing 100, after the platform 126 is inserted into the accommodation space 131 through the side opening 132, the second through holes 125 of the waterproof gasket 120 and the fixing holes 134 on the circular end surface 133 are aligned, so as to allow the fixing members 920 to pass through the second through holes 125 and the fixing holes 134 to fix the waterproof gasket 120 to the circular end surface 133.

In some embodiments, as shown in FIG. 3, the waterproof gasket 120 further includes a protrusion 127 disposed on the side of the main body 121 facing towards the accommodation space 131. For example, in FIG. 3, the protrusion 127 is disposed on the platform 126. The protrusion 127 is configured to abut against the circuit board 900, thereby fixing the position of the circuit board 900 inside the accommodation space 131.

Figure 4:
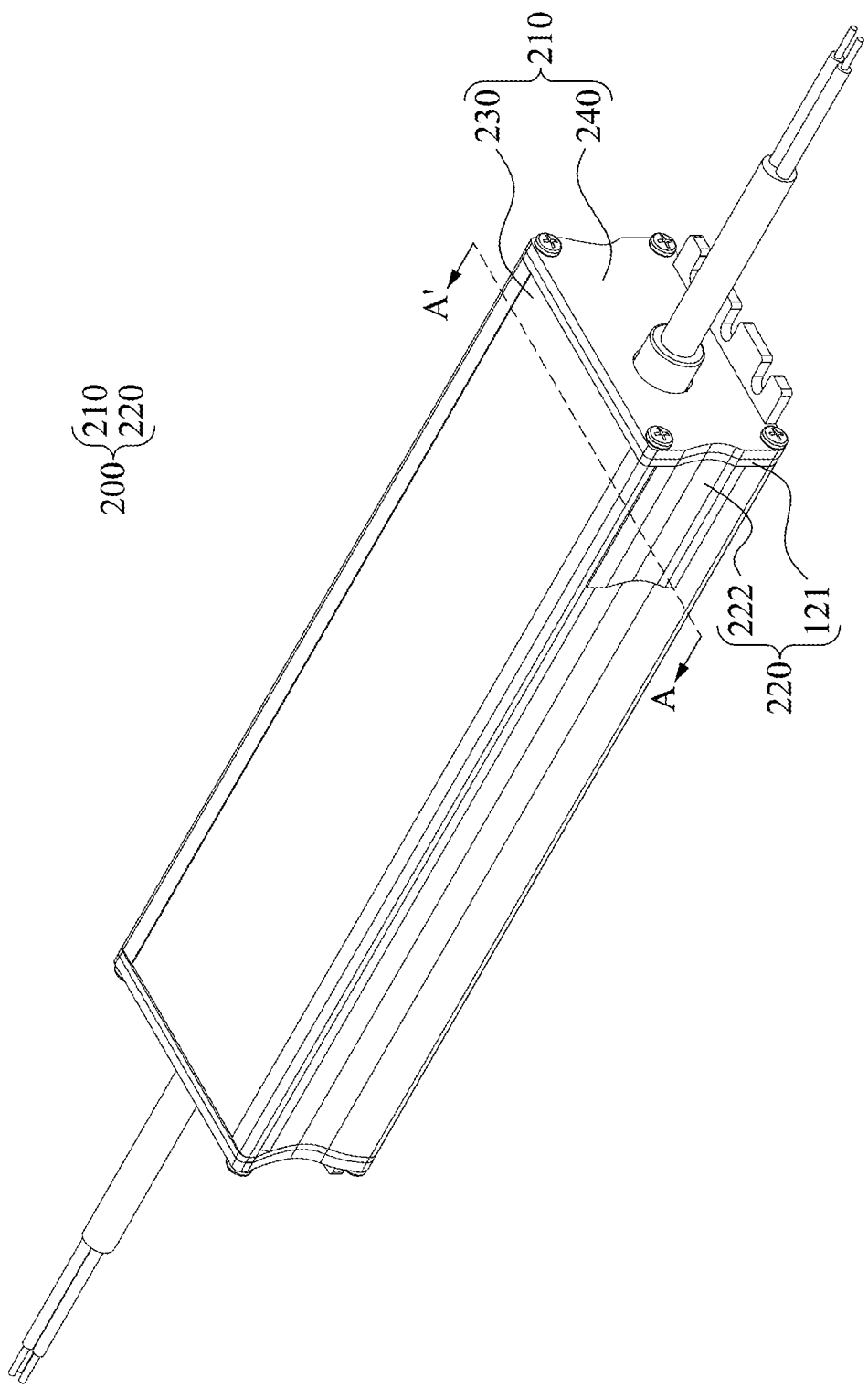
FIG. 4 illustrates an assembled view of a waterproof casing in accordance with another embodiment of the present disclosure.
Figure 5:
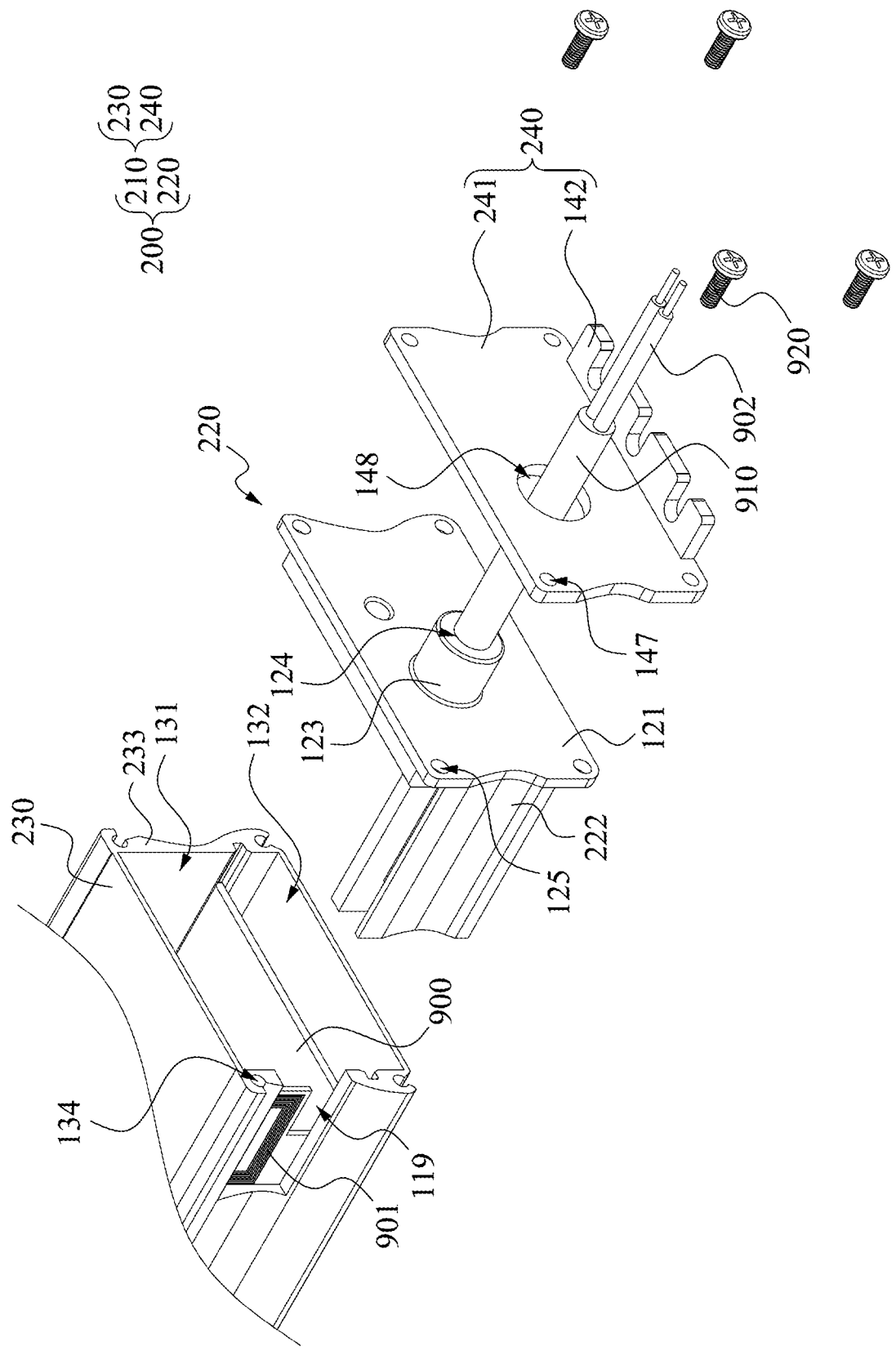
FIG. 5 is a partially enlarged exploded view of the waterproof casing shown in FIG. 4.
Figure 6:
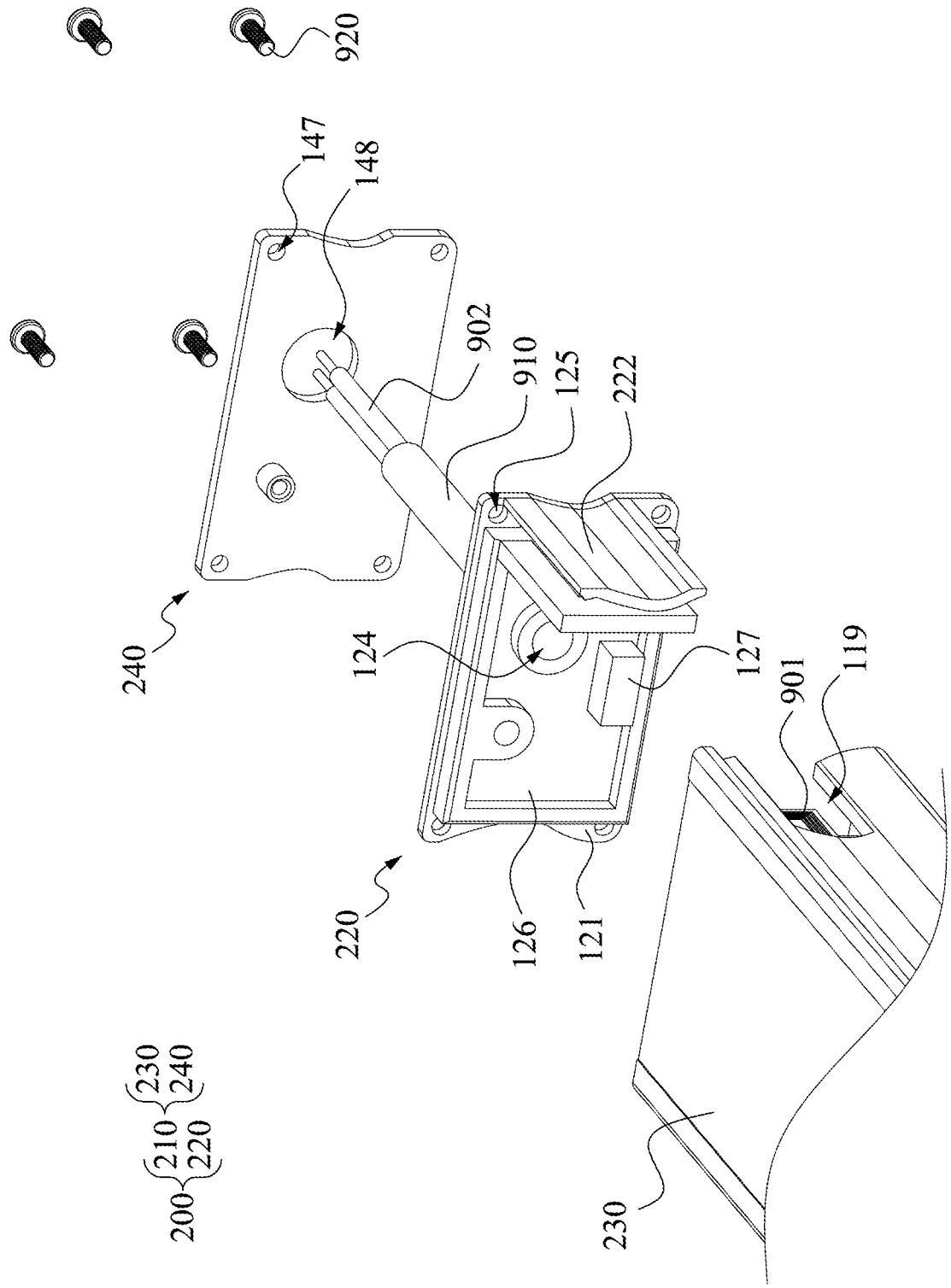
FIG. 6 is another partially enlarged exploded view of the waterproof casing shown in FIG. 4.

Please refer to FIGS. 4-6. FIG. 4 illustrates an assembled view of a waterproof casing 200 in accordance with another embodiment of the present disclosure, FIG. 5 is a partially enlarged exploded view of the waterproof casing 200 shown in FIG. 4, and FIG. 6 is another partially enlarged exploded view of the waterproof casing 200 shown in FIG. 4. The waterproof casing 200 includes a box 210 and a waterproof gasket 220. The box 210 includes a housing 230 and an end cover 240. The waterproof gasket 220 includes a main body 121 and an extending portion 222.

As shown in FIG. 5, a difference between the present embodiment and the embodiment shown in FIGS. 1 and 3 is that the antenna 901 is positioned to face the left side of the housing 230, and the communication opening 119 of the box 210 is positioned accordingly. In the present embodiment, the communication opening 119 is located on the housing 230 and faces towards the antenna 901. The communication opening 119 communicates with the side opening 132 of the housing 230, thus creating a gap on the circular end surface 233 of the housing 230. Another difference between the present embodiment and the embodiment shown in FIGS. 1 and 3 is that the extending portion 222 of the waterproof gasket 220 extends perpendicularly from a left edge of the main body 121. The extending portion 222 hermetically abuts against an inner edge of the communication opening 119, thereby preventing liquid from entering the housing 230 through the communication opening 119.

The positions of the antenna 901 and the communication opening 119 are merely illustrated as examples. The present disclosure is not limited thereto. A person with an ordinary skill in relevant art may adjust the positions of the antenna 901 and the communication opening 119 based on practical needs. The communication opening 119 may be located on the left side, right side, top, or bottom of the housing. The position of the extending portion of the waterproof gasket may be rearranged accordingly to seal the communication opening.

Figure 7:
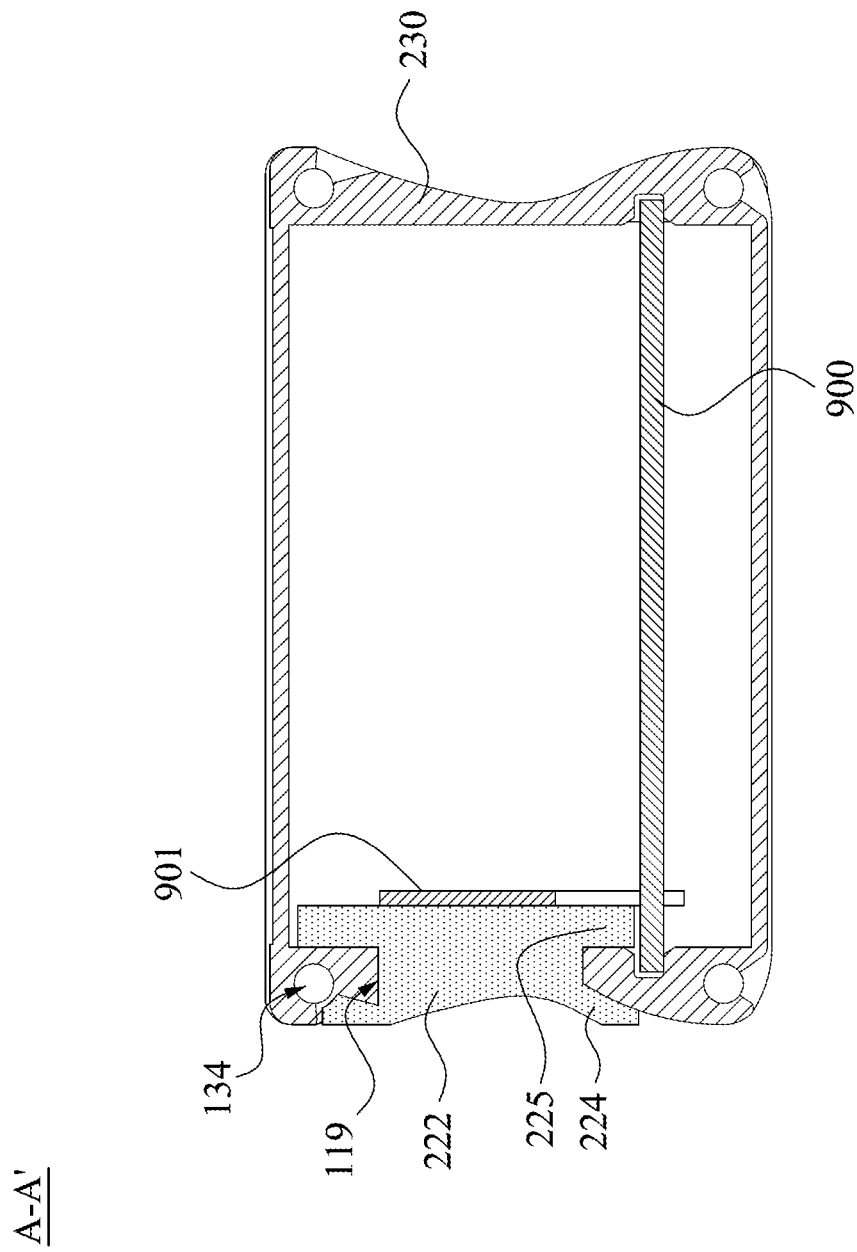
FIG. 7 is a cross-sectional view of the waterproof casing taken along line A-A' shown in FIG. 4.

Please refer to FIG. 7, which is a cross-sectional view of the waterproof casing 200 taken along line A-A' shown in FIG. 4. In some embodiments, the extending portion 222 has an outer ring structure 224. The outer ring structure 224 extends beyond the inner edge of the communication opening 119 and hermetically abuts against an outer surface of the housing 230. In this way, liquid penetration through the communication opening 119 may be more effectively prevented.

The shape of the outer ring structure 224 may be adjusted based on the shape of the outer surface of the housing 230 to maintain a tighter fit between the outer ring structure 224 and the housing 230. For example, in FIG. 5, the outer surface of the side wall of the housing 230 has curved shape. A surface of the outer ring structure 224 configured to abut against the housing 230 may be designed to have a curvature different from that of the outer surface of the housing 230. In this way, after the assembly of the waterproof casing 200, the outer ring structure 224 may be tightly fitted with the outer surface of the housing 230.

In some embodiments, as shown in FIG. 7, the extending portion 222 further has an inner ring structure 225 for further enhancing the waterproof capability of the waterproof casing 200. The inner ring structure 225 extends beyond the inner edge of the communication opening 119 and hermetically abuts against an inner surface of the housing 230. With the outer ring structure 224 and the inner ring structure 225, the extending portion 222 tightly wraps the portions of the housing 230 surrounding the communication opening 119, and thus liquid cannot easily pass between the extending portion 222 and the housing 230 to enter the accommodation space 131.

In some embodiments, before the waterproof gasket 220 and the housing 230 are assembled, a distance between the outer ring structure 224 and the inner ring structure 225 is slightly smaller than a thickness of the housing 230. Therefore, force has to be applied to insert the extending portion 222 of the waterproof gasket 220 into the communication opening 119 through a side of the communication opening 119 adjacent to the side opening 132. After the waterproof gasket 220 and the housing 230 are assembled, the aforementioned dimensional difference causes the outer ring structure 224 and the inner ring structure 225 to tightly clamp the housing 230, thereby effectively sealing the side opening 132 to prevent liquid penetration.

A person with an ordinary skill in relevant art may selectively incorporate the outer ring structure 224 and the inner ring structure 225 into the extending portion 222 based on the desired waterproof capability. For example, if the waterproof casing 200 only need to protect against splashing of water, the extending portion 222 may not need to include the outer ring structure 224 and the inner ring structure 225, or only need to include one of them.

Please refer back to FIGS. 5 and 6. In some embodiments, the waterproof gasket 220 may include other structural features of the waterproof gasket 120 shown in FIGS. 2 and 3. For example, the waterproof gasket 220 may include the wire bushing 123, the platform 126, and the protrusion 127. Similarly, the end cover 240 may include other structural features of the end cover 140 shown in FIGS. 2 and 3. For example, the end cover 240 may include a covering portion 241 and a fixing portion 142, and the covering portion 241 may have wire opening 148. Discussions regarding these features can be found in the related descriptions above and will not be described again herein.

In sum, in the waterproof casing of the present disclosure, the waterproof gasket includes the extending portion to seal the communication opening, thereby resolving issues of poor tightness between the mask and the casing and the mask easily falling off found in conventional waterproof structures.

Although the present disclosure has been disclosed by the above embodiments, the present disclosure is not limited thereto. Any person skilled in the art can make various changes and modifications without departing from the spirit and the scope of the present disclosure. Therefore, the protective scope of the present disclosure shall be the scope of the claims as attached.

What is claimed is:

1. A waterproof casing for packaging a circuit board, the circuit board having an antenna, the waterproof casing comprising:
   a housing having an accommodation space and a side opening communicating with each other, wherein the accommodation space is configured to accommodate the circuit board;
   a waterproof gasket, comprising:
      a main body covering the side opening; and
      an extending portion extending from the main body; and
   an end cover that abuts against a side of the main body away from the accommodation space and is fixed to the housing, wherein the end cover has a wire opening, the waterproof gasket further comprises a wire bushing passing through the wire opening;
   wherein the end cover has a communication opening positioned corresponding to the antenna and separated from the wire opening, the communication opening is configured to allow the antenna to conduct wireless transmission through the communication opening, the extending portion of the waterproof gasket is located on the side of the main body away from the accommodation space, and the extending portion hermetically covers the communication opening.

2. The waterproof casing of claim 1, wherein the extending portion of the waterproof gasket extends into the communication opening, and a peripheral edge of the extending portion hermetically abuts against an inner edge of the communication opening.

3. The waterproof casing of claim 1, wherein the waterproof gasket further comprises a platform extending into the accommodation space through the side opening, and a peripheral edge of the platform hermetically abuts against an inner surface of the housing.

4. The waterproof casing of claim 1, wherein the waterproof gasket further has a channel passing through the main body and the wire bushing.

5. The waterproof casing of claim 1, wherein the waterproof gasket further comprises a protrusion disposed on a side of the main body facing towards the accommodation space, and the protrusion is configured to abut against the circuit board.

6. The waterproof casing of claim 1, wherein the end cover comprises:
   a covering portion abutting against the side of the main body away from the accommodation space; and
   a fixing portion extending from an edge of the covering portion.

7. The waterproof casing of claim 1, wherein the end cover has a plurality of first through holes, the waterproof gasket has a plurality of second through holes, and the end cover is fixed to the housing by a plurality of fixing members passing through the first through holes and the second through holes.

8. A waterproof casing for packaging a circuit board, the circuit board having an antenna, the waterproof casing comprising:
   a housing having an accommodation space and a side opening communicating with each other, wherein the accommodation space is configured to accommodate the circuit board;
   a waterproof gasket, comprising:
      a main body covering the side opening; and
      an extending portion extending from the main body; and
   an end cover that abuts against a side of the main body away from the accommodation space and is fixed to the housing;
   wherein the housing has a sidewall, the sidewall has an end surface at least partially surrounding the side opening, the sidewall is formed with a communication opening, the communication opening is positioned corresponding to the antenna and extends from an inner surface of the sidewall to an outer surface of the sidewall, and the extending portion of the waterproof gasket hermetically covers the communication opening.

9. The waterproof casing of claim 8, wherein the extending portion of the waterproof gasket extends from an edge of the main body and hermetically covers the communication opening.

10. The waterproof casing of claim 8, wherein the communication opening communicates with the side opening.

11. The waterproof casing of claim 8, wherein the extending portion of the waterproof gasket has an inner ring structure that extends beyond an inner edge of the communication opening and hermetically abuts against the inner surface of the sidewall of the housing.

12. The waterproof casing of claim 8, wherein the extending portion of the waterproof gasket has an outer ring structure that extends beyond an inner edge of the communication opening and hermetically abuts against the outer surface of the sidewall of the housing.

* * * * *